(12) United States Patent
Vandamme et al.

(10) Patent No.: US 6,200,908 B1
(45) Date of Patent: Mar. 13, 2001

(54) PROCESS FOR REDUCING WAVINESS IN SEMICONDUCTOR WAFERS

(75) Inventors: Roland Vandamme, Portland, OR (US); Ankur Desai, St. Peters, MO (US); Dale Witte, St. Peters, MO (US); Yun-Biao Xin, St. Peters, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/366,815

(22) Filed: Aug. 4, 1999

(51) Int. Cl.[7] .................................................. H01L 21/00
(52) U.S. Cl. ...................... 438/719; 216/59; 216/84; 438/8; 438/9; 438/692; 438/753
(58) Field of Search ........................... 438/8, 9, 14, 691, 438/692, 719, 745, 753; 216/38, 59, 60, 67, 79, 84, 85, 88, 91, 99

(56) References Cited

U.S. PATENT DOCUMENTS

| | | | |
|---|---|---|---|
| 4,668,366 | 5/1987 | Zarowin | 204/192.1 |
| 4,877,479 | 10/1989 | McNeil et al. | 156/626 |
| 5,238,532 | 8/1993 | Zarowin et al. | 156/643 |
| 5,254,830 | 10/1993 | Zarowin et al. | 219/121.43 |
| 5,290,382 | 3/1994 | Zarowin et al. | 156/345 |
| 5,291,415 | 3/1994 | Zarowin et al. | 364/474.3 |
| 5,292,400 | 3/1994 | Mumola | 156/643 |
| 5,336,355 | 8/1994 | Zarowin et al. | 156/345 |
| 5,372,674 | 12/1994 | Steinberg | 156/643 |
| 5,375,064 | 12/1994 | Bollinger | 364/474.3 |
| 5,376,224 | 12/1994 | Zarowin | 156/643 |
| 5,382,551 * | 1/1995 | Thakur et al. | 438/8 |
| 5,393,370 * | 2/1995 | Ohta et al. | 438/9 X |
| 5,419,803 | 5/1995 | Mumola | 216/38 |
| 5,449,638 | 9/1995 | Hong et al. | 437/61 |
| 5,474,647 | 12/1995 | Poultney et al. | 156/626.1 |
| 5,491,571 | 2/1996 | Williams et al. | 359/59 |
| 5,543,919 | 8/1996 | Mumola | 356/382 |
| 5,563,709 | 10/1996 | Poultney | 356/371 |
| 5,810,643 | 9/1998 | Toyama | 451/5 |
| 5,827,779 | 10/1998 | Masumura et al. | 438/691 |
| 5,953,578 * | 9/1999 | Lee | 438/9 |

FOREIGN PATENT DOCUMENTS

| | | |
|---|---|---|
| 668614 A2 | 8/1995 | (EP) . |
| 741406 A2 | 11/1996 | (EP) . |
| 798405 A2 | 10/1997 | (EP) . |
| 798766 A1 | 10/1997 | (EP) . |
| 57-202734 | 12/1982 | (JP) . |
| 4-226031 | 8/1992 | (JP) . |
| 6-295891 | 10/1994 | (JP) . |
| WO 98/09804 | 3/1998 | (WO) . |
| WO 98/44541 | 10/1998 | (WO) . |
| WO 98/44549 | 10/1998 | (WO) . |

OTHER PUBLICATIONS

F. Shimura, "Semiconductor Silicon Crystal Technology", *Academic Press*, pp. 191–195, 1989.

G. Pfeiffer et al., "Final Polish for Soi Wafers—Surface Roughness and TTV Degradation", 1995 IEEE International SOI Conference Proceedings, Tucson, Oct. 3–5, 1995, Institute of Electrical and Electronics Engineers, p. 172–173.

* cited by examiner

*Primary Examiner*—William Powell
(74) *Attorney, Agent, or Firm*—Senniger, Powers, Leavitt & Roedel

(57) ABSTRACT

A process for reducing the waviness of a semiconductor wafer utilizing plasma assisted chemical etching is disclosed. The process includes measuring the surface profile at discrete points on one surface of the wafer independent from the apposing surface, computing a dwell time versus position map based on the measured surface profiles, and selectively removing material from each surface of the wafer by plasma assisted chemical etching to reduce the waviness of the wafer.

22 Claims, 2 Drawing Sheets

PROCESS FOR REDUCING WAVINESS IN SEMICONDUCTOR WAFERS

BACKGROUND OF THE INVENTION

The present invention relates to a process for reducing the waviness of a semiconductor wafer. In particular, the present invention provides a process for reducing the waviness of a semiconductor wafer by selectively locally removing material from the front and/or back surface of the wafer independently from the apposing surface by plasma assisted chemical etching.

Semiconductor wafers, such as silicon wafers, are typically obtained by slicing a single crystal ingot in a direction normal to the axis of the ingot to produce thin wafers, grinding the wafers to planarize their front and back surfaces, etching the planarized wafers to remove damage created by the slicing and grinding, and polishing the etched surfaces. As a consequence of these shaping operations, the wafers may have one or more of surface roughness, waviness, or global warp. In general, surface roughness appears as jagged surface irregularities, surface waviness appears as undulatory surface irregularities having a periodicity which is generally greater than about 5 mm and less than about 30 mm (which may vary across the surface of the wafer) and an amplitude of about 0.5 $\mu$m to about 5 $\mu$m from an ideal planer surface, and global warp appears as undulatory surface irregularities having a periodicity which is generally greater than about 30 mm, and an amplitude which may be significantly greater than that exhibited by waviness. The differences between surface roughness, waviness, and global warp are schematically illustrated in FIGS. 1(a) through FIG. 1(f).

FIG. 1(a) schematically illustrates a perfectly flat wafer in cross section wherein the front surface 1 and the back surface 2 are ideal planer surfaces, perpendicular to the axis 3 of the wafer and parallel to the median surface 4 located at the midpoint between the front surface 1 and the back surface 2 of the wafer.

FIG. 1(b) schematically illustrates a wafer exhibiting waviness in cross section, wherein an ideal planer surface 5 is normal to the axis 3 of the wafer, and tangential to a valley 6 of the wave. The amplitude of the waves is equal to the distance from peak 7 adjacent to valley 6 to the ideal planer surface 5 (ie. the vertical distance from peak to valley). The wavelength is equal to the distance from any point to the next point characterized by the same phase of the wave (for example, the wavelength is equal to the distance from one peak to an adjacent peak or from one valley to the adjacent valley). Wafers exhibiting undulations having a wavelength of about 5 mm to about 30 mm and an amplitude of about 0.5 $\mu$m to about 5 $\mu$m on the surface the wafer are considered to exhibit waviness. The amplitude and wavelength may vary across the surface of the wafer.

As shown in FIG. 1(b), waviness directly affects the flatness of the wafer since the distance from the front surface 1 to the ideal planer surface 5 varies across the surface of the wafer. In addition, the peaks and valleys of the front surface 1 do not necessarily align with the peaks and valleys of the back surface 2 resulting in thickness variations wherein the thickness is measured as the vertical distance from any point on the front surface 1 of the wafer to the apposing point on the back surface 2 of the wafer.

The surface of the wafer may also exhibit a degree of roughness appearing as jagged irregularities on the front surface 1 and/or back surface 2 of the wafer. FIG. 1(c) schematically illustrates a wafer exhibiting roughness in cross section. In contrast to waviness, micro-roughness is characterized by a peak to peak distance of less than about 100 $\mu$m and an amplitude or vertical distance from peak to valley of less than 5 $\mu$m. In addition, saw wires leave a signature roughness on the wafer surface, which has a wavelength of 0.2 to 1.5 mm with an amplitude of about 1.0 to about 50 $\mu$m.

Typically, wafers produced by conventional wafer shaping operations may also exhibit global warp, wherein the median surface is undulatory having a periodicity which is generally greater than about 30 mm and having an amplitude that may be significantly larger than exhibited by either waviness or roughness. FIG. 1(d) schematically illustrates a wafer exhibiting global warp, wherein the median surface 4 is not an ideal planer surface.

In addition to exhibiting either waviness, roughness or global warp, a wafer may exhibit any combination or all of the irregularities on the surface of the wafer. These different wavelength irregularities superimpose on each other to form a typical wafer topology after being subjected to wiresawing. For example, FIG. 1(e) schematically illustrates a wafer exhibiting both waviness and roughness in cross section and FIG. 1(f) schematically illustrates a wafer exhibiting roughness, waviness and global warp.

The flatness of a wafer is affected by roughness, waviness and global warp. Traditional shaping processes such as grinding, chemical etching and polishing are directed towards improving either the roughness or the global warp, but fail to eliminate waviness. Furthermore, wafers exhibiting only global warp may be drawn down on a vacuum chuck such that the median surface is a planer surface creating a sufficiently flat surface for device manufacturing. By removing the warp temporarily using a vacuum chuck, device manufacturers are able to process these wafers without much difficulty. The vacuum chuck will not, however, remove the waviness from the surface of the wafer. Consequently, when a wafer exhibiting waviness is drawn down to temporarily eliminate global warp, the front surface of the wafer is not sufficiently flat for device manufacturing. Thus, device manufacturers require that wafers do not exhibit waviness.

Waviness can be revealed using a "Magic Mirror" inspection tool, wherein light is reflected off of the wafer surface onto an imaging device. The imaging device produces a black and white image of the reflected light with waviness appearing as dark stripes or features in the image. Device manufacturers specify featureless wafers (ie. wafers not exhibiting waviness). Therefore, semiconductor wafers exhibiting waviness will be rejected in the final inspection which will cause yield loss.

European Patent Application No. EP 0 798405 A2 discloses a process for reducing "unevenness or swelling having cycles of 0.5 to 30 mm" on as-cut wafers right after the slicing process and before lapping, wherein a wax or like adhesive is used to hold the back surface to a chucking base plate, thus absorbing the swelling while the front surface is subsequently ground flat. In addition, EP O 798405 A2 discloses a double-sided grinding process wherein both sides of the wafer are subjected to a grinding process simultaneously to reduce the unevenness or swelling and improve the flatness of the wafers. Each of these approaches, however, relies on mechanical and/or chemomechanical processes for reducing thickness and flatness variations which leave contaminants on the surface and cause subsurface damage to the substrate.

Alternatively, EP O 798405 A2 suggests a third embodiment wherein a conventional plasma assisted chemical etching (PACE) process is used to remove stock from the surface of the wafer based on the total thickness variation to reduce unevenness or swelling and improve the flatness of semiconductor wafers. However, conventional PACE processes utilizing thickness measurements do not adequately remove waviness.

In the PACE process, a plasma generates a chemically reactive species from a gas such as sulfur hexafluoride, and the surface of the substrate facing the plasma etching electrode is etched to remove material from the surface at defined locations to improve the thickness uniformity and produce wafers with parallel apposing surfaces.

Although conventional PACE technology has many recognized advantages over other substrate thinning or flattening methods, it is not without limitations. Conventional PACE processes typically utilize a capacitance probe to measure the thickness (ie. the distance from the front surface to the back surface) of the wafer at discrete positions throughout the surface of the wafer. A conventional PACE process applied to a wafer, with a back surface that is wavy, may result in a front surface parallel to the back surface such that it is more uniform in thickness with the same degree of waviness as exhibited on the back surface of the wafer. Therefore, wiresaw induced waviness occurring on both surfaces of the wafer will not be effectively removed with a conventional PACE process.

SUMMARY OF THE INVENTION

Among the several objects of this invention, therefore, may be noted the provision of a process which reduces the waviness of a semiconductor wafer; the provision of a process for improving the yield for a semiconductor production run at a relatively low cost; the provision of a process for flattening a semiconductor wafer and reducing the waviness using PACE technology where material is removed from each surface of the wafer independently to provide two parallel surfaces free from wiresaw induced waviness.

Briefly, therefore, the process of the present invention uses a material removal tool, preferably PACE, to remove material from the front and back surfaces of the wafer based on independent front and back surface measurements to reduce the waviness and improve the yields and/or throughput of semiconductor wafer processing.

The present invention is further directed to a process wherein a material removal tool, preferably PACE, is used to remove material from one surface of the wafer based on independent measurements of the surface and then removing material from the apposing surface based on conventional thickness measurements.

The present invention is further directed to a process comprising flattening the wafer using conventional techniques, such as grinding and/or lapping, removing material from the front and back surfaces of the wafer based on independent front and back surface measurements, and polishing said wafer using conventional polishing techniques.

Other objects and features of this invention will be in part apparent and in part pointed out hereinafter.

DETAILED DESCRIPTION OF THE PREFERRED EMBODIMENTS

Figure 1A:
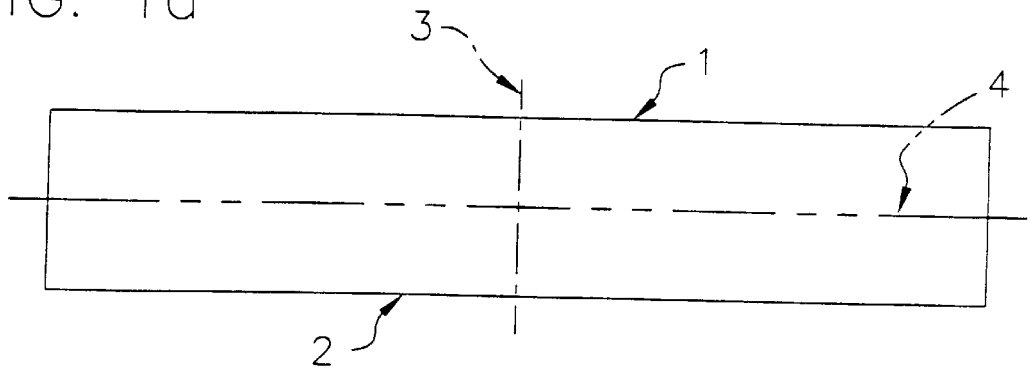
FIG. 1(a) shows a cross sectional view of a wafer wherein the front and back side surfaces are ideal planer surfaces.

In accordance with the present invention, it has been discovered that both the resulting waviness, as well as the quality of a semiconductor wafer, can be improved by incorporating an additional material removal step, with conventional wafer shaping processes for a semiconductor wafer. Surprisingly, wafers with reduced waviness can be prepared by selectively removing material from the front and/or back surfaces of a semiconductor wafer by plasma assisted chemical etching using a metrology device designed to independently measure the topography of each individual surface, and then separately removing stock from each side, eliminating waviness caused by prior processing steps.

The process of the present invention is designed to utilize independent surface measurements to allow shaping of each surface independently. Wafers which have been prepared from the process of the current invention have reduced waviness. In addition, the wafers may be produced with the current process without the need for conventional chemical etching.

Silicon is a preferred material for the wafer with the conductivity type and resistivity not being critical. The wafer may have any diameter and target thickness which is appropriate for a semiconductor application. For example, the diameter may be from about 100 mm to about 300 mm or greater and the thickness may be from about 475 $\mu$m to about 900 $\mu$m or greater, with the thickness typically increasing with increasing diameter. The wafer may also have any crystal orientation. In general, however, the wafers have a <100> or <111> crystal orientation.

The process of the present invention employs as a starting material a semiconductor wafer, sliced from a single crystal ingot using any means known to those skilled in the art, such as, for example, an internal diameter slicing apparatus or a wiresaw slicing apparatus. The means for slicing the wafer from the ingot is not critical to the present invention, however, in a preferred embodiment, the wafer is sliced from the ingot using a wiresaw slicing apparatus, having, for example, a slurry mixture comprising silicon carbide and glycol at a density of about 1.63 g/cc to about 1.7 g/cc, a maximum wirespeed of about 10 m/sec to about 15 m/sec, a total cycle length of approximately 250 to 700 meters, and a back/forth ratio of approximately ⅗ to ⅘.

Once the wafer is sliced from the single crystal ingot, the wafer is then subjected to a conventional grinding process to reduce the nonuniform damage caused by the slicing process and to improve the parallelism and flatness of the wafer. Such grinding processes are well known to persons skilled in the art. While the grinding step is not critically important to the present invention, a preferred embodiment of the present invention employs a grinding process to remove about 20 $\mu$m to about 30 $\mu$m of stock from each surface to roughly improve flatness using a resin bond, 1200 to 6000 mesh wheel operating at about 2000 RPM to about 4000 RPM with a feed rate of about 10 mic/min to about 100 mic/min.

After the initial flattening step, a surface profile is generated by measuring the surface elevation at a plurality of discrete positions on the front surface of the wafer using a measurement device and mapping the elevations as a function of position on the front surface of the wafer. Surface elevations are measured at intervals ranging from about 0.1 to about 5 mm, more preferably about 0.5 to about 3 mm and most preferably from about 1 to about 2 mm across the surface of the wafer, such that, a wafer having a diameter of 200 mm may be measured for example at over 17,000 sites across the surface of the wafer, or at intervals of 1.8 mm.

The elevation measurements are taken relative to a pre-determined reference plane. The reference plane may be, for example, an ideal planer surface perpendicular to the axis of the wafer located at a fixed distance from the sensor of the measurement device either above or below the surface of the wafer. Alternatively, the reference plane may, for example, approximate the median surface of the wafer as determined from previously produced wafers. Preferably, the reference plane is a plane perpendicular to the axis of the wafer located at the sensor of the surface measurement device.

The tool used to measure the individual surface topography may be any metrology device such as an apparatus capable of measuring surface elevations relative to a reference plane independent from the apposing surface. Preferably, however, the surface is measured using an Acu-Flat 300 HT optical laser-based measurement device which is commercially available from IPEC Precision, Inc. (Bethel, Conn.). The wafer is placed vertically in the AcuFlat 300 HT and is passed through Optical laser-based sensors set at a fixed distance on each side of the wafer. The AcuFlat 300 measures the distance from each of the Optical laser-based sensors to the corresponding surface of the wafer at approximately 4,400 discrete points or greater, distributed evenly about the surface to provide surface profile data on both surfaces. The surface profile data represent point-by-point elevations on the surface of the wafer relative to a predetermined reference plane perpendicular to the axis of the wafer, located above the surface of the wafer at a distance equal to the distance from the Electro-Optical Sensors to the wafer.

Persons skilled in the art can modify the present embodiments disclosed herein to replace such optical measurement tools with other metrology apparatus known in the art and can measure the surface profile based on reference planes differing from those employed by said optical measurement tools.

Figure 1B:
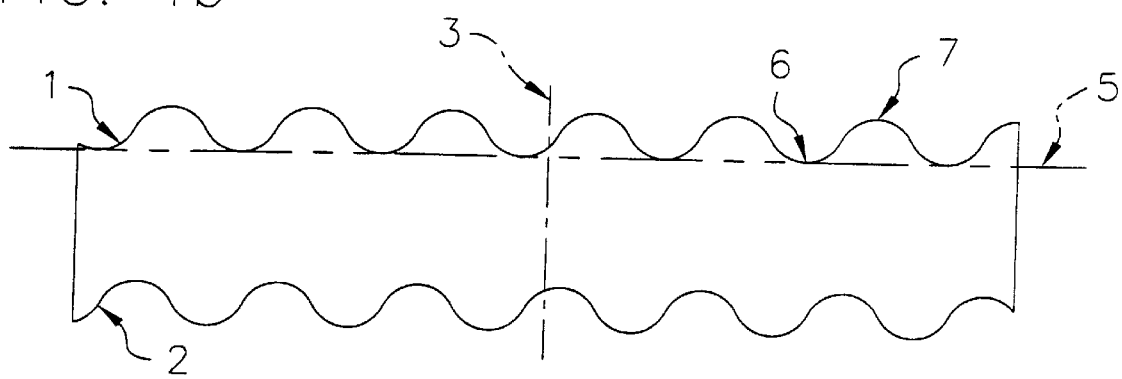
FIG. 1(b) shows a cross sectional view of a wafer exhibiting waviness.
Figure 1C:
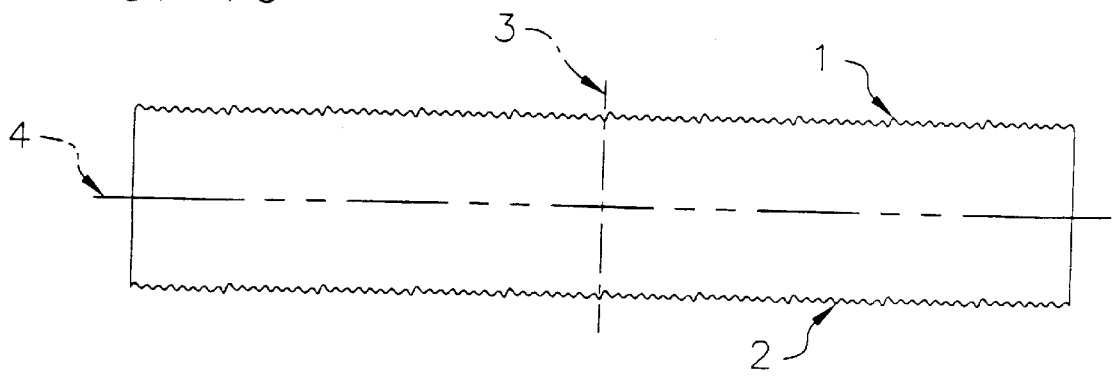
FIG. 1(c) shows a cross sectional view of a wafer exhibiting roughness.
Figure 1D:
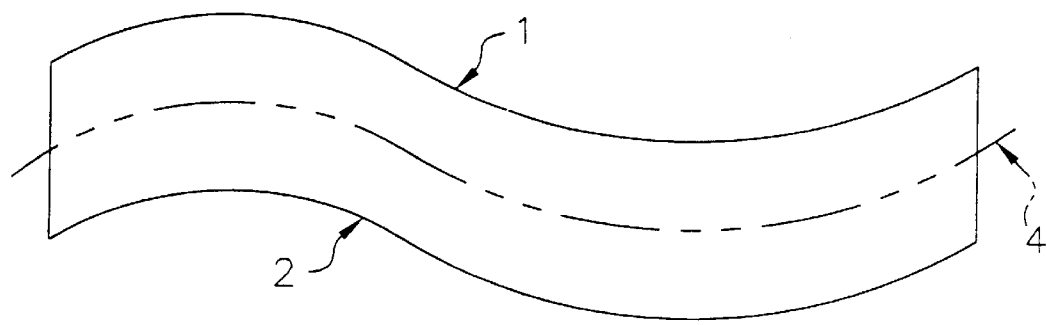
FIG. 1(d) shows a cross sectional view of a wafer exhibiting global warp.
Figure 1E:
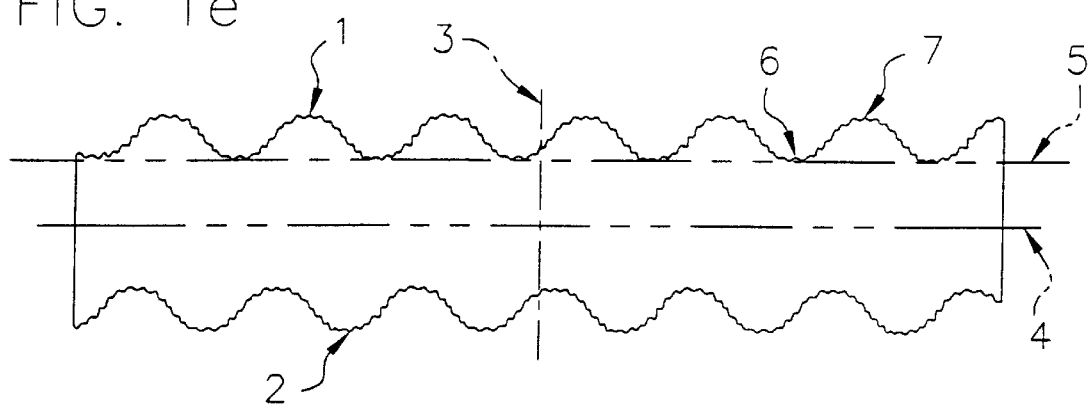
FIG. 1(e) shows a cross sectional view of a wafer exhibiting roughness and waviness.
Figure 1F:
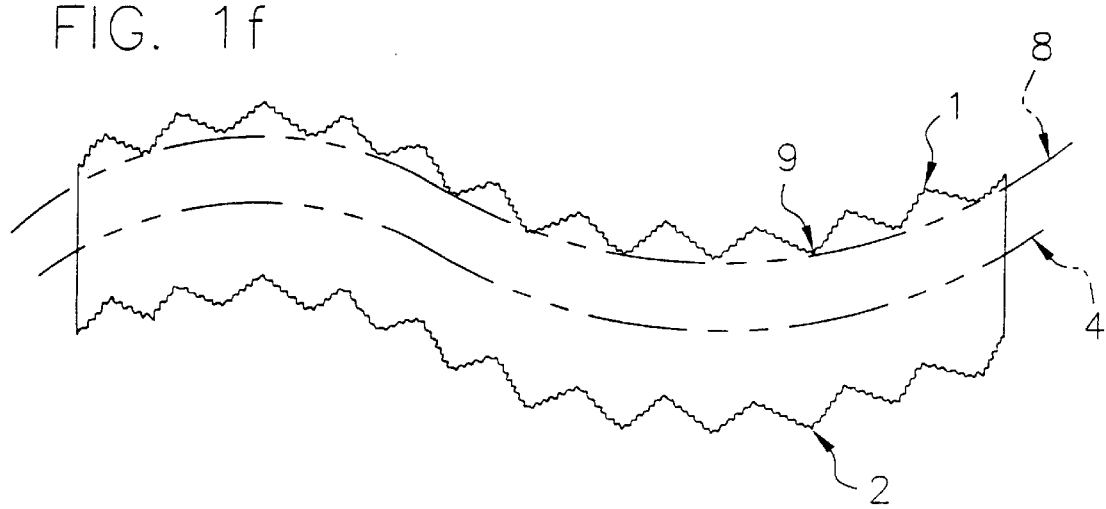
FIG. 1(f) shows a cross sectional view of a wafer exhibiting roughness, waviness and global warp.

A target surface elevation is then determined which represents a smooth surface at the desired depth beneath the surface of the wafer. The surface may be chosen, for example, to represent a flat planer surface approximately perpendicular to the axis of the wafer at a constant elevation relative to the reference plane. For example, the ideal planer surface 5 represented in FIG. 1(*b*) which is perpendicular to the axis 3 may be the chosen as the target surface. Alternatively, the target surface may be represented by a mathematical equation representing a surface that approximates any desired shape of the surface after stock removal wherein the mathematical equation determines the target elevation as a function of position along the surface of the wafer. Preferably, the target surface is chosen by mathematically modeling the surface profile data to produce an equation representing a surface 8 approximately parallel to the median surface 4 as shown in FIG. 1(*f*) wherein the wafer exhibits global warp, waviness and surface roughness. Furthermore, the surface 8 should be selected to be tangential to the point 9 on the actual surface of the wafer that is closest to the median surface to minimize the amount of stock removed. Any means may be employed for mathematically modeling the surface profile data including, but not limited to, computer software programs designed to model 3 dimensional surfaces. Persons skilled in the art are aware of such computer software programs suitable for 3 dimensional modeling. For example, Matlab software is available from The MathWorks Inc., Natick, Mass. and is suitable for 3 dimensional mathematical modeling.

The amount of stock to be removed at each discrete point can be calculated using an algorithm which operates on the measured elevation data and the target surface elevation. For example, the amount of material to be removed can be determined by calculating a target elevation using the target surface model and subtracting the target elevation from the actual surface elevation at each discrete position. The difference between the two values determines the amount of stock which must be removed at each discrete position of the front surface of the wafer to achieve the target surface.

Once the amount of material to be removed from each position of the wafer is determined, this information is processed and converted to a dwell time versus position map which is used to control a stock removal tool during a stock removal step. This stock removal step may be executed using any tool which is capable of locally and precisely removing stock from small regions of the front surface of the wafer. The tool may be, for example, a chemical/mechanical polishing tool having micropolishing heads. Preferably, however, it is a PACE removal tool of the type described in U.S. Pat. Nos. 4,668,366, 5,254,830, 5,291,415, 5,375,064, 5,376,224, and 5,491,571, which are commercially available from IPEC/Precision, Inc. under the PWS-200 trademark. The dwell time versus position map then controls the amount of time that the plasma removal electrode must remain at each specified position over the front surface of the substrate to remove enough material to achieve the target elevation.

After the desired amount of stock has been removed from each discrete position on the front surface of the wafer, the surface essentially parallel to, but opposite from the front surface, (the back surface of the wafer) is then measured similarly to the front surface to produce a topographic map of the back surface of the wafer, preferably using an Acuflat optical laser-based measurement device. Since the back surface is measured independently from the front surface, the back surface may alternatively be measured prior to removing stock from the front surface.

The amount of stock to be removed at each discrete point on the back surface can be calculated in a manner similar to the front surface as previously described. Alternatively, the distance between the front surface wherein the waviness has been previously eliminated, and the back surface may be measured using a capacitance tool (such as those commercially available from ADE Corporation (Newton, Mass.) under the ADE 9700 trademark), or other thickness measurement tools known by those skilled in the art. The reduction in thickness can be calculated using an algorithm which operates on the thickness profile data and a target thickness value for the wafer. For example, the amount of material to be removed can be determined by subtracting the target thickness from the thickness profile data at each discrete position. The difference between the two values determines the amount of stock which must be removed at each position on the front surface of the wafer to achieve the target thickness.

Once the amount of material to be removed from each position on the back surface of the wafer is determined, this information is processed and converted to a dwell time versus position map which is used to control a stock removal tool, preferably a PACE removal tool of the type described above. The dwell time versus position map then controls the amount of time that the plasma removal electrode must remain at each specified position over the back surface of the wafer to produce the desired surface.

Preferably, the PACE step of the present invention removes an average of between about 1 µm and about 4 µm of material from each surface of the semiconductor wafer to reduce the waviness. Typical removal rates for conventional PACE processes are generally between about 1 µm per minute and about 2 µm per minute for 200 mm semiconductor substrates, and between about 0.5 µm and about 1 µm per minute for 300 mm substrates. It should be recognized by those skilled in the art, however, that removal rates can vary depending upon the specific conditions of the PACE apparatus.

Prior to and/or after stock removal from either side, the wafer optionally may be cleaned to remove contaminants such as slurry particles and metals introduced during the initial flattening step and sulfur deposited on the wafer surface by the plasma during stock removal. The wafer may be cleaned using any suitable cleaning procedure that does not materially affect the thickness profile or flatness of the wafer. Such cleaning procedures are well known in the art and include, for example, the RCA method (described in F. Shimura, *Semiconductor Silicon Crystal Technology* (Academic Press 1989), pp. 189–191), or an appropriate water rinse.

After the stock removal step, the wafer is subjected to a double-sided polishing process to remove an additional 5 µm to 15 µm and roughly polish both surfaces of the wafer. The double-sided polishing process may be any double-sided polishing process known in the art and may be, for example, the process described in U.S. Pat. No. 5,422,316. After the double-sided polishing step, the wafer may optionally be subjected to a finish polishing step to reduce the surface micro-roughness in terms of RMS. Plasma etching each surface independently reduces the waviness of the surface, however, the surface irregularities referred to as roughness are several orders of magnitude smaller than the surface undulations referred to as waviness and may continue to exist in the surface of the wafer. Furthermore, plasma etching processes will typically leave the surface of the silicon wafer with a significant amount of surface roughness (rms) as measured, for example, with an Atomic Force Microscope (AFM). Thus, it is preferred that the roughness of the plasma etched wafer surfaces be reduced to a value which is less than that level of roughness. Preferably, the roughness, RMS, is reduced to a value of about 0.3 nm over an area of 1 mm×1 mm, to a value of about 0.2 nm over an area of 1 mm×1 mm.

The finish polishing step reduces nonspecularly reflected light (haze) and enhances the specularity of the wafer surface. An unpolished wafer includes high and low frequency components of roughness on its surface. The high frequency roughness causes high light scatter from the surface due to haze. Finish polishing minimizes the high and low frequency surface roughness and reduces haze. The algorithm to determine the amount of removal is as follows: (1) determine the peak ("p") to valley ("v") roughness of the plasma etched surface, r(p-v); (2) design the polishing process to remove approximately 3r(p-v) to 4r(p-v) using a finishing type slurry (e.g., diluted Glanzox); and (3) conventional RCA type cleaning. Removing this small amount of silicon, typically does not detract from the flatness of the wafer.

In general, only about 0.1 µm to about 2 µm of silicon will be removed in this polish step. The finish polishing may be carried out in a chemical/mechanical polishing process using, for example, a dilute ammnonia stabilized colloidal silica slurry and conventional polishing equipment. A preferred ammonia stabilized colloidal silica slurry is Glanzox 3900, which is commercially available from Fujimi Incorporated of Aichi Pref. 452, Japan. Glanzox 3900 has a silica content of from about 8% to about 10% and a particle size of from about 0.025 µm to about 0.035 µm.

A $p^+$-type wafer is typically polished for about 300 seconds, followed by a quench phase. A finish polishing time of about 240 seconds is conventional for a $p^+$-type wafer. After finish polishing, the substrate optionally is subjected to a suitable cleaning procedure, such as use of a standard cleaning solution such as $H_2O$—$H_2O_2$—$NH_4OH$.

In view of the above, it will be seen that the several objects of the invention are achieved.

As various changes could be made in the above-described semiconductor substrate flattening process without departing from the scope of the invention, it is intended that all matters contained in the above description be interpreted as illustrative and not in a limiting sense.

What is claimed is:

1. A process for reducing the waviness of a semiconductor wafer having a front surface and a back surface using plasma assisted chemical etching, the process comprising:

measuring initial elevations at discrete positions on the front surface of the wafer relative to a reference plane other than the back surface, to produce a contour map of the front surface of the wafer independent from the back surface;

selecting a target elevation for each discrete position relative to said reference plane based on a desired surface contour;

determining the amount of stock to be removed at each of said discrete positions on the front surface of the wafer to reduce the initial elevation to the target elevation, said determination comprising use of an algorithm operating on the initial elevations and the target elevation and computing a dwell time versus position map for the front surface of the wafer to determine the length of time a plasma electrode must etch the front surface of the wafer; and removing material selectively from the front surface of the wafer based on the dwell time versus position map by plasma assisted chemical etching to shape the front surface of the wafer to the target elevation.

2. The process as set forth in claim 1 wherein the target surface elevation is determined by mathmatically modeling the initial surface profile data to produce an equation representing a surface approximately parallel to the global warp of the wafer.

3. The process as set forth in claim 1 wherein between about 0.1 µm and about 15 µm of material is removed from the front surface.

4. The process as set forth in claim 1 wherein the wafer is a silicon wafer.

5. The process as set forth in claim 1 wherein the wafer is then finish polished to remove about 0.1 µm to about 2 µm of material from the front surface.

6. The process as set forth in claim 1 wherein the wafer is then rough polished to remove between about 5 µm to about 15 µm of material from the surface.

7. The process as set forth in claim 6 wherein the wafer is then finish polished to remove about 0.1 µm to about 2 µm of material from the front surface.

8. A process for reducing the waviness of a semiconductor wafer having a front surface and a back surface using plasma assisted chemical etching, the process comprising:

measuring initial elevations at discrete positions across the front surface of the wafer relative to a reference plane, to produce a contour map of the front surface of the wafer independent from the back surface;

selecting a target elevation for each discrete position relative to said reference plane based on the surface contour desired after stock removal;

determining the amount of stock to be removed at each of said discrete positions across the front surface of the wafer to reduce the initial elevation to the target elevation, said determination comprising use of an algorithm operating on the initial elevations and the target elevation and computing a dwell time versus position map for the front surface of the wafer to determine the length of time a plasma electrode must etch the front surface of the wafer;

removing material selectively from the front surface of the wafer based on the dwell time versus position map by plasma assisted chemical etching to shape the front surface of the wafer to the target elevation;

measuring initial elevations at discrete positions across the back surface of the wafer relative to a reference plane, to produce a contour map of the back surface of the wafer independent from the front surface;

selecting a target elevation for each discrete position relative to said reference plane based on the surface contour desired after stock removal;

determining the amount of stock to be removed at each of said discrete positions across the back surface of the wafer to reduce the elevation to the target elevation, said determination comprising use of an algorithm operating on the initial elevations and the target elevation and computing a dwell time versus position map for the back surface of the wafer to determine the length of time a plasma electrode must etch the back surface of the wafer;

removing material selectively from the back surface of the wafer based on the dwell time versus position map by plasma assisted chemical etching to shape the back surface of the wafer to the target elevation.

9. The process as set forth in claim 8 wherein the target surface elevation is determined by mathmatically modeling the surface profile data to produce an equation representing a surface approximately parallel to the global warp of the wafer.

10. A process as set forth in claim 8 wherein between about 1 μm and about 4 μm of material is removed from the front surface of the wafer.

11. A process as set forth in claim 8 wherein between about 1 μm and about 4 μm of material is removed from the back surface of the wafer.

12. A process as set forth in claim 8 wherein the wafer is a silicon wafer.

13. The process as set forth in claim 8 wherein the wafer is then finish polished to remove about 0.1 μm to about 2 μm of material from the front surface.

14. The process as set forth in claim 8 wherein the wafer is then rough polished to remove between about 5 μm to about 15 μm of material from the surface.

15. The process as set forth in claim 14 wherein the wafer is then finish polished to remove about 0.1 μm to about 2 μm of material from the front surface.

16. A process for producing semiconductor wafers with reduced waviness having a front surface and a back surface using plasma assisted chemical etching, the process comprising:

measuring initial elevations at discrete positions across the front surface of the wafer relative to a reference plane, to produce a contour map of the front surface of the wafer independent from the back surface;

selecting a target elevation for each discrete position relative to said reference plane based on the surface contour desired after stock removal;

determining the amount of stock to be removed at each of said discrete positions across the front surface of the wafer to reduce the initial elevation to the target elevation, said determination comprising use of an algorithm operating on the initial elevations and the target elevation and computing a dwell time versus position map for the front surface of the wafer to determine the length of time a plasma electrode must etch the front surface of the wafer;

removing material selectively from the front surface of the wafer based on the dwell time versus position map by plasma assisted chemical etching to flatten the front surface of the wafer to the target elevation;

measuring the thickness of a semiconductor wafer at discrete positions on the back surface of the wafer using the front surface as the reference surface;

determining the amount of stock to be removed at each of said discrete positions across the back surface of the wafer to reduce the thickness to a target thickness computing a dwell time versus position map for the back surface of the substrate to determine the length of time a plasma electrode must etch the back surface of the wafer; and removing material selectively from the back surface of the substrate based on the dwell time versus position map by plasma assisted chemical etching to flatten the back surface of the wafer to a desired thickness relative to the front surface.

17. A process as set forth in claim 16 wherein between about 1 μm and about 4 μm of material is removed from the front surface of the wafer.

18. A process as set forth in claim 16 wherein between about 1 μm and about 4 μm of material is removed from the back surface of the wafer.

19. A process as set forth in claim 16 wherein the wafer is a silicon wafer.

20. The process as set forth in claim 16 wherein the wafer is then finish polished to remove about 0.1 μm to about 2 μm of material from the front surface.

21. The process as set forth in claim 16 wherein the wafer is then rough polished to remove about 5 μm to about 15 μm of material from the surface.

22. The process as set forth in claims 21 wherein the wafer is then finish polished to remove about 0.1 μm to about 2 μm of material from the front surface.

* * * * *